United States Patent
Chou et al.

(10) Patent No.: US 9,117,904 B2
(45) Date of Patent: Aug. 25, 2015

(54) SEMICONDUCTOR STRUCTURE HAVING TRIMMING SPACERS

(71) Applicant: UNITED MICROELECTRONICS CORP., Hsin-Chu (TW)

(72) Inventors: Shyan-Liang Chou, Tainan (TW); Tsung-Min Kuo, Tainan (TW); Po-Wen Su, Kaohsiung (TW); Chun-Mao Chiou, Chiayi County (TW); Feng-Mou Chen, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/608,165

(22) Filed: Jan. 28, 2015

(65) Prior Publication Data

US 2015/0137197 A1     May 21, 2015

Related U.S. Application Data

(62) Division of application No. 13/447,311, filed on Apr. 16, 2012, now Pat. No. 8,975,673.

(51) Int. Cl.
*H01L 29/76* (2006.01)
*H01L 29/78* (2006.01)
*H01L 29/49* (2006.01)

(52) U.S. Cl.
CPC ........ *H01L 29/7843* (2013.01); *H01L 29/4983* (2013.01)

(58) Field of Classification Search
USPC .......... 257/288, 406, 213; 438/196, 591, 197, 438/299
See application file for complete search history.

(56) References Cited

U.S. PATENT DOCUMENTS

| | | | |
|---|---|---|---|
| 7,314,793 B2 | 1/2008 | Frohberg | |
| 2005/0266639 A1* | 12/2005 | Frohberg et al. | 438/257 |
| 2006/0003520 A1 | 1/2006 | Huang | |
| 2006/0024872 A1 | 2/2006 | Goodlin | |
| 2010/0062592 A1 | 3/2010 | Clark | |

* cited by examiner

*Primary Examiner* — Errol Fernandes
(74) *Attorney, Agent, or Firm* — Winston Hsu; Scott Margo

(57) ABSTRACT

A semiconductor structure includes a substrate, a gate electrode disposed on the substrate, wherein the gate electrode has a first top surface. A gate dielectric layer is disposed between the substrate and the gate electrode. A silicon carbon nitride spacer surrounds the gate electrode, wherein the silicon carbon nitride spacer has a second top surface not higher than the first top surface. A silicon oxide spacer surrounds the silicon carbon nitride spacer.

1 Claim, 5 Drawing Sheets

SEMICONDUCTOR STRUCTURE HAVING TRIMMING SPACERS

CROSS REFERENCE TO RELATED APPLICATIONS

This patent application is a divisional application of and claims priority to U.S. patent application Ser. No. 13/447,311, filed on Apr. 16, 2012, and entitled "METHOD OF TRIMMING SPACERS AND SEMICONDUCTOR STRUCTURE THEREOF" the entire contents of which are incorporated herein by reference.

BACKGROUND OF THE INVENTION

1. Field of the Invention

The present invention relates to a method of trimming a silicon carbon nitride spacer and a semiconductor structure formed by the aforesaid method.

2. Description of the Prior Art

As semiconductor processes advance to the very deep sub micron level, how to increase the driving current for MOS transistors has become a critical issue in this field.

To attain higher performance of a semiconductor device, attempts have been made to use a strained silicon (Si) layer for increasing the mobility of electrons or holes. Taking advantage of a stressor is a common way to increase the effect of the MOS transistors. Forming a tensile or a compressive stressor on the substrate and using the MOS transistors to change the band structure of silicon can increase mobility of electrons.

A multilayer spacer is often used in the MOS transistors. Therefore, before forming the stressor, the outmost spacer is usually removed so that the stressor is closer to the substrate underneath the gate. After removing the outmost spacer, however, the top surface of the spacer contacting the gate will be higher than the top surface of the gate. Therefore, the stressor deposited on the gate will be uneven.

SUMMARY OF THE INVENTION

It is an objective of the present invention to provide a method of trimming spacers to solve the aforesaid problem.

According to the present invention, a method of trimming spacers comprises: first a substrate having a first top surface is provided; a gate structure is disposed on the substrate, wherein the gate structure comprises agate dielectric layer and a gate electrode; a mask layer is disposed on the gate structure; a silicon carbon nitride spacer surrounds the gate structure and the mask layer; a first spacer material covers the gate structure, the mask layer and the silicon carbon nitride spacer; a second spacer material covers the first spacer material conformally and a Y direction is defined as parallel to the normal vector of the first top surface of the substrate. An etching process is then performed to etch the second spacer material, the first spacer material and the mask layer, wherein the etched first spacer material forms a first spacer surrounds the silicon carbon nitride, the etched second spacer material forms a second spacer surrounding the first spacer and the silicon carbon nitride spacer exposes a first portion, and wherein the etched mask layer has a thickness and a second top surface, the etched first spacer has a third top surface, and a first distance between the third top surface and the second top surface in the Y direction is larger than half of the thickness of the etched mask layer. A first removing process is performing to remove part of the first spacer so that the silicon carbon nitride spacer exposes a second portion. Finally, a second removing process is performed to clean the gate structure, the silicon carbon nitride spacer, the first spacer and the second spacer so as to remove the second spacer, the mask layer, part of the first portion and part of the second portion of the silicon carbon nitride spacer.

According to the present invention, a semiconductor structure comprises: a substrate; a gate electrode disposed on the substrate, wherein the gate electrode has a first top surface; a gate dielectric layer disposed between the substrate and the gate electrode; a silicon carbon nitride spacer surrounding the gate electrode, wherein the silicon carbon nitride spacer has a second top surface not higher than the first top surface; and a silicon oxide spacer surrounding the silicon carbon nitride spacer.

According to the present invention, a semiconductor structure comprises: a substrate having a first top surface; a gate electrode disposed on the substrate, wherein the gate electrode has a second top surface; a gate dielectric layer disposed between the substrate and the gate electrode; a silicon carbon nitride spacer surrounding the gate electrode, wherein the silicon carbon nitride spacer has a third top surface; a silicon oxide spacer surrounding the silicon carbon nitride spacer; and a material layer covering the substrate, the gate electrode, the silicon carbon nitride spacer and the silicon oxide spacer, wherein the material layer contacting the first top surface has a horizontal surface, the material layer contacting a sidewall of the silicon oxide spacer has a vertical surface, and an angle between the horizontal surface and the vertical surface is between 88-96 degrees.

The present invention utilizes an etching process and a removing process to expose a first portion and a second portion of the silicon carbon nitride spacer. Therefore, more silicon carbon nitride spacer can be removed during a process of removing the silicon nitride spacer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
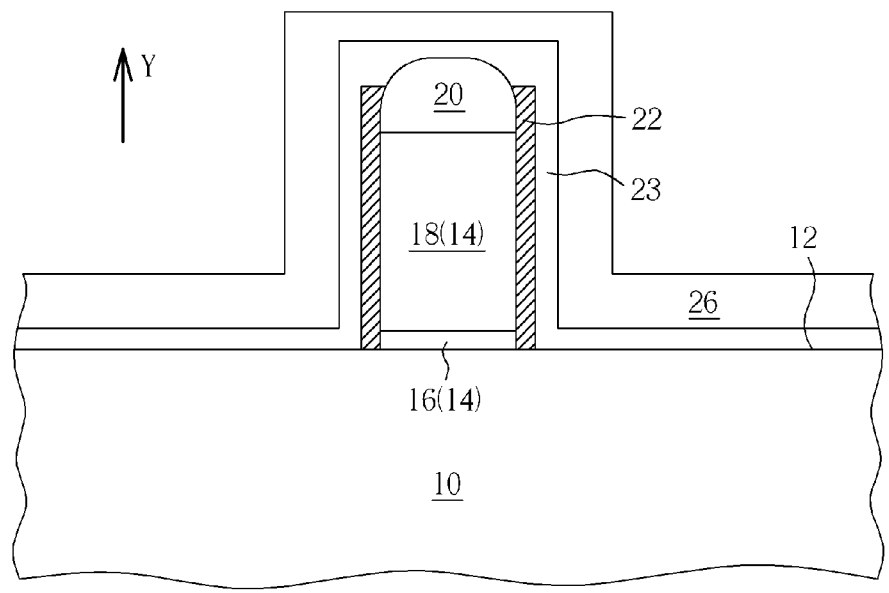
FIG. 1 to FIG. 10 depict a method of trimming spacers according to an exemplary embodiment of the present invention

FIG. 1 to FIG. 10 depict a method of trimming spacers according to an exemplary embodiment of the present invention. As shown in FIG. 1, a substrate 10 having a top surface 12 is provided. A Y direction is defined as parallel to the normal vector of the top surface 12 of the substrate 10. The substrate 10 may be formed by a SiGe substrate, silicon-on-insulator (SOI) substrate, gallium arsenide (GaAs) substrate, gallium arsenide-phosphide (GaAsP) substrate, indium phosphide (InP) substrate, gallium aluminum arsenic (GaAlAs) substrate, or indium gallium phosphide (InGaP) substrate. After a deposition and an etching processes, a gate dielectric layer 16, a gate electrode 18, and a mask layer 20 are formed in sequence on the substrate 10. The gate structure 14 comprises a gate dielectric layer 16 which is a high K material and gate electrode 18. A silicon carbon nitride spacer 22 surrounding the gate structure 14 and the mask layer 20 is then formed. A first spacer material 23 is formed on the gate structure 14, the mask layer 20 and the silicon carbon nitride spacer 22. A second spacer material layer 26 covers the first spacer material 23 conformally. The aforesaid first spacer material 23 is preferably silicon oxide. The second spacer material 26 and the mask layer 20 are preferably silicon nitride. The gate electrode 18 is preferably doped polysilicon. The gate electrode 18 can be a sacrifice electrode, and can be replaced by a metal gate in the following steps.

Figure 2:
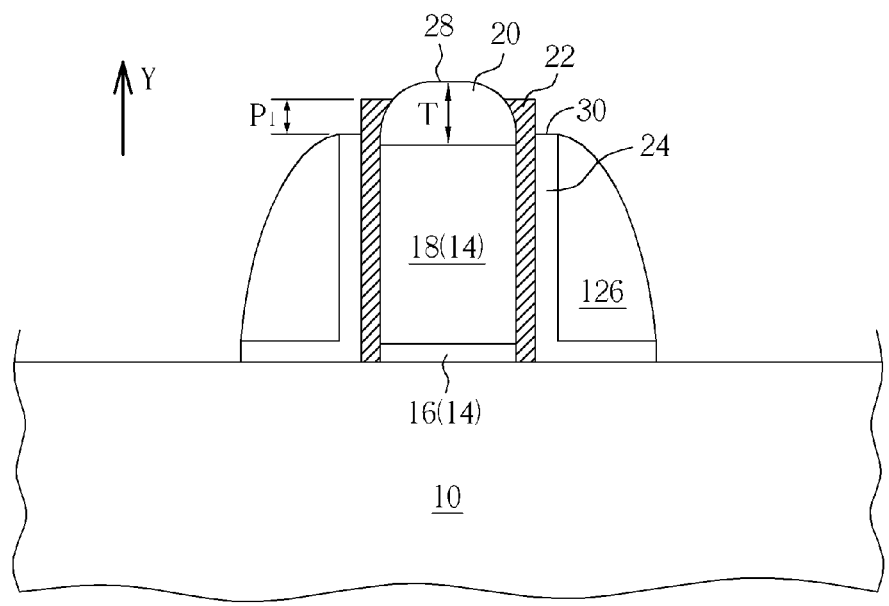

As shown in FIG. 2, an etching process is performed to etch the second spacer material 26, the first spacer material 23 and the mask layer 20. The etched first material 23 forms a first spacer 24 surrounding the silicon carbon nitride spacer 22, the etched second material 26 forms a second spacer 126 surrounding the first spacer 24. After the etch process, the height of the first spacer 24 is reduced in the Y direction so that a first portion $P_1$ of the silicon carbon nitride spacer 22 originally covered by the first spacer 24 is exposed. The first portion $P_1$ is preferably between 50 to 100 nm. The etched mask layer 20 has a thickness T and a top surface 28. The etched first spacer 24 has an exposed first top surface 30. The distance between the first top surface 30 of the first spacer 24 and the top surface 28 of the mask layer 20 is larger than half of the thickness T of the mask layer 20 in the Y direction. The distance between the first top surface 30 and the top surface 28 in the Y direction is not larger than the thickness T, however. In other words, the first spacer 24 is not lower than the interface between the mask layer 20 and the gate electrode 18. According to a preferred embodiment of the present invention, the thickness of the mask layer 20 is larger than 300 angstroms. However, the thickness T can be adjusted according to the thickness of the second spacer 126 so as to make the second spacer 126 and the mask layer 20 to be removed at the same removing process.

Figure 3:
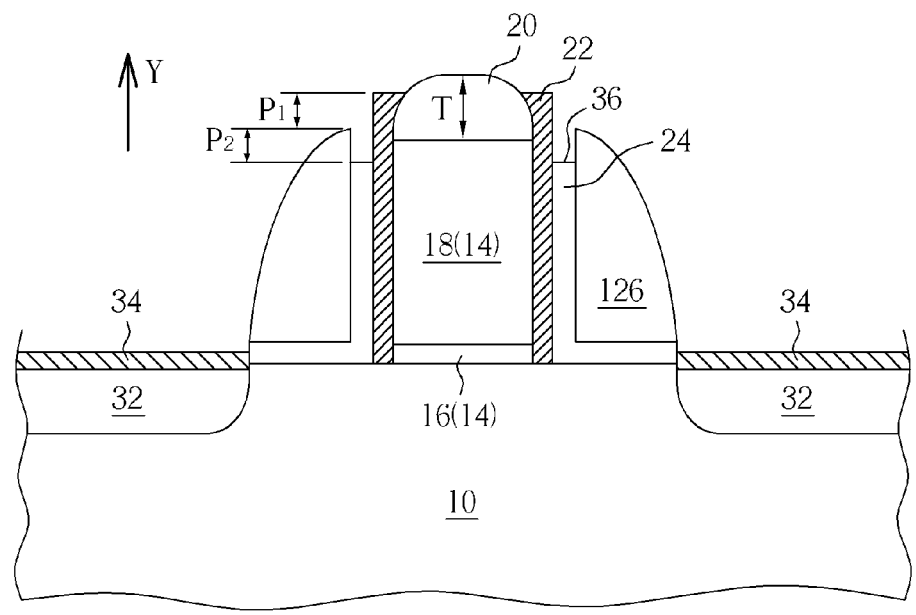

As shown in FIG. 3, the top surface 12 of the substrate 10 is cleaned optionally by dilute hydrofluoric acid. Then, two source/drain regions 32 are formed in the substrate 10 at two sides of the gate structure 14 respectively. A silicide process is performed to form a silicide layer 34 on each of the source/drain regions 32. Moreover, a removing process such as a SiCoNi process is often performed before the silicide process to remove native oxide on the surface of the substrate 10. Therefore, the silicon oxide can further be removed when the native oxide is removed by the SiCoNi process, meaning that part of the first spacer 24 is removed during the SiCoNi process, and a second portion $P_2$ of the silicon carbon nitride spacer 22 is thereby exposed. After the SiCoNi process, the first spacer 24 has an exposed second top surface 36. The second top surface 36 is lower than the interface between the mask layer 20 and the gate electrode. 18.

Additionally, the SiCoNi process primarily includes reacting fluorine-containing gas with the silicon oxide to synthesize diammonium fluosilicate (($NH_4)_2SiF_6$). In this way, the native oxide can be removed optionally. The aforesaid fluorine-containing gas can be hydrogen fluoride (HF) or nitrogen trifluoride ($NF_3$).

According to another preferred embodiment, a post contact salicide process can be utilized in the present invention to replace the aforesaid silicide process. In other words, the aforesaid silicide process and the SiCoNi process will not be performed if the post contact salicide process is used. The post contact salicide process includes forming a silicide layer on the source/drain regions 32 after a contact hole is formed in an interlayer dielectric layer. However, the dilute hydrofluoric acid can still be used to clean the surface 12 of the substrate 10 before forming the source/drain regions 32. The dilute hydrofluoric acid can remove the native oxide. Alternatively, another cleaning process can be performed to remove the native oxide.

Figure 4:
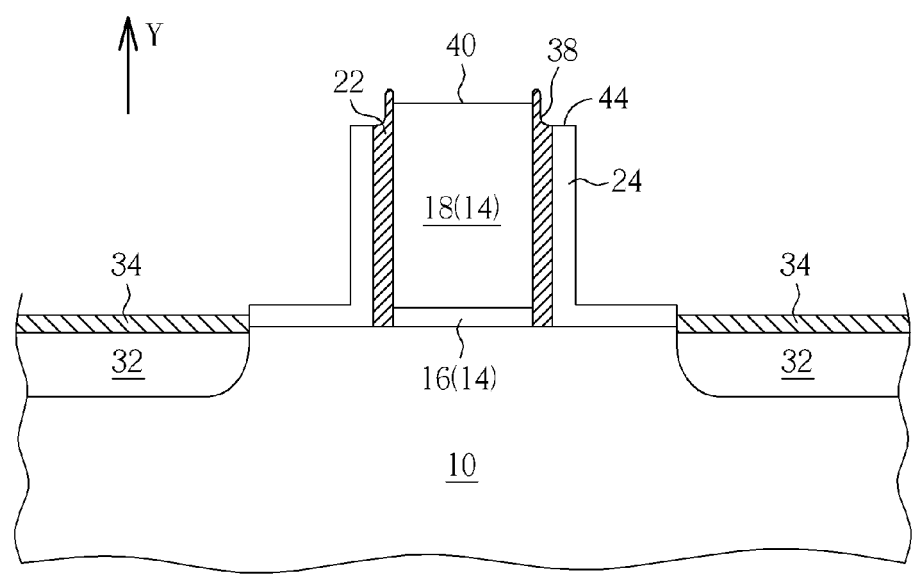
Figure 5:
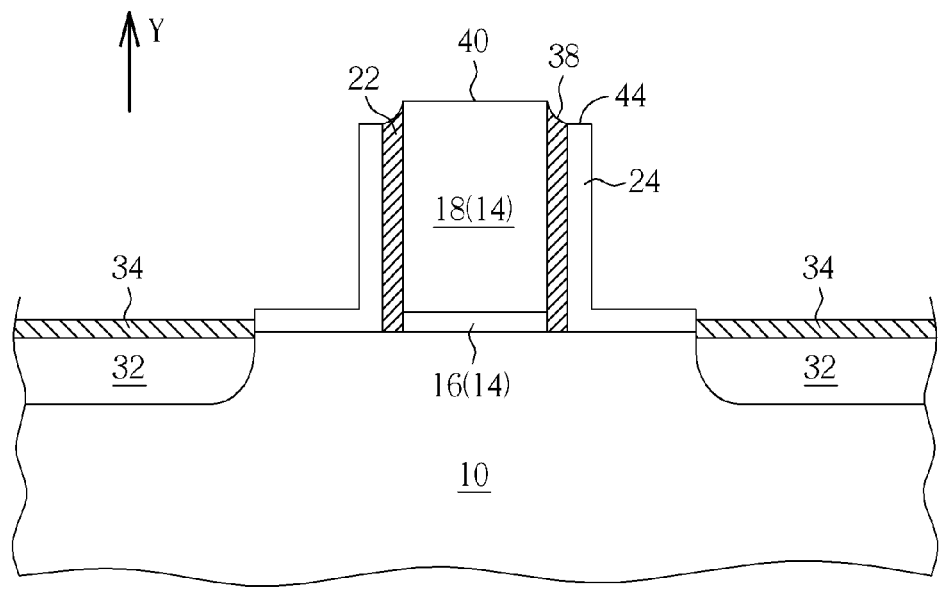

As shown in FIG. 4, another removing process is performed. The removing process includes clean the gate structure 14, the silicon carbon nitride spacer 22, the first spacer 24 and the second spacer 126. The solution utilized in this clean process is usually phosphate acid which can remove the silicon nitride entirely, while also removing part of the silicon carbon nitride based on the etching ratio of phosphate acid to the silicon nitride and the silicon carbon nitride. Therefore, the second spacer 126 and the mask layer 20 are totally removed, and the first portion $P_1$ and the second portion $P_2$ of the silicon carbon nitride spacer 22 are partly removed during this removing process. After this removing process, a top surface 38 of the silicon carbon nitride spacer 22 is exposed, and a top surface 40 of the gate structure 18 is exposed. It is noteworthy that at least part of the top surface 38 of the silicon carbon nitride spacer 22 is lower than the top surface 40 of the gate electrode 18. Alternatively, as shown in FIG. 5, by adjusting the cleaning time or other parameters, the entire top surface 38 of the silicon carbon nitride spacer 22 is lower than the top surface 40 of the gate electrode 18.

Figure 6:
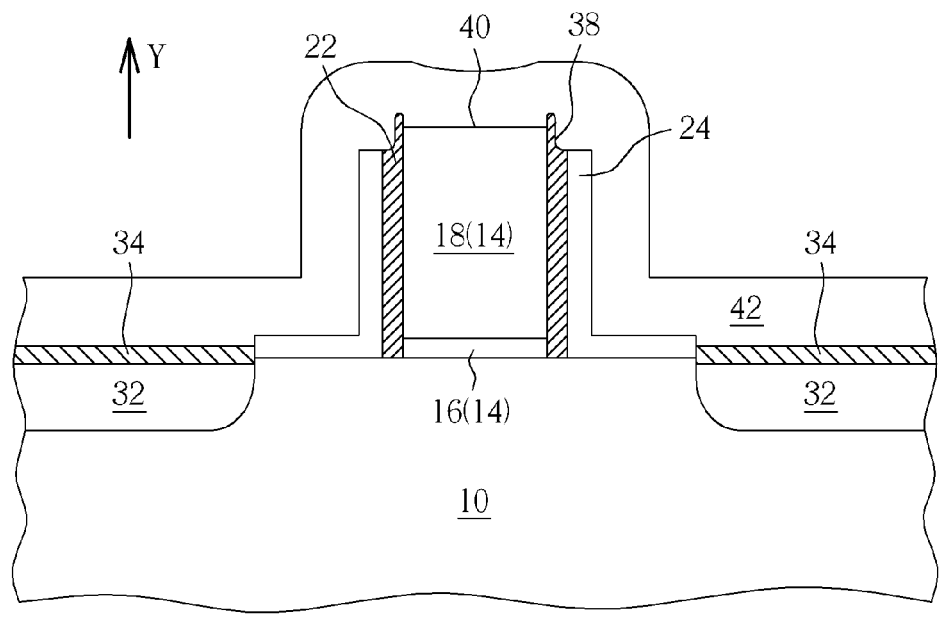

Please refer to FIG. 6. The step shown in FIG. 6 immediately follows the step shown in FIG. 4. After the second spacer 126 and the mask layer 20 are removed, based on the types of the MOS transistor, an etch stop layer (CESL) 42 is formed conformally to cover the gate electrode 18, the silicon carbon nitride spacer 22 and the first spacer 24. An anneal process or/and a UV is then selectively performed to form a tensile strain or a compressive strain in the substrate 10 or to allow dopants in the source/drain regions 32 to diffuse.

Figure 7:
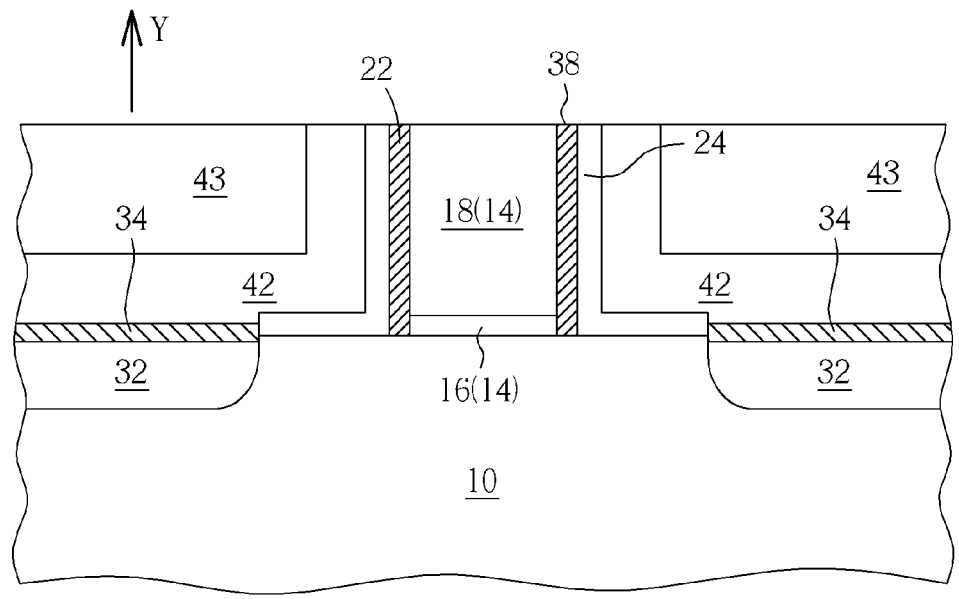

As shown in FIG. 7, an interlayer dielectric layer 43 is formed on the CESL 42. Then, a planarization process is performed to remove part of the interlayer dielectric layer 43 and the CESL 42 on the gate structure 18 until the gate structure 18 is exposed. The planarization process can be performed by a chemical mechanical polishing, a dry etch, a wet etch or a combination thereof.

Figure 8:
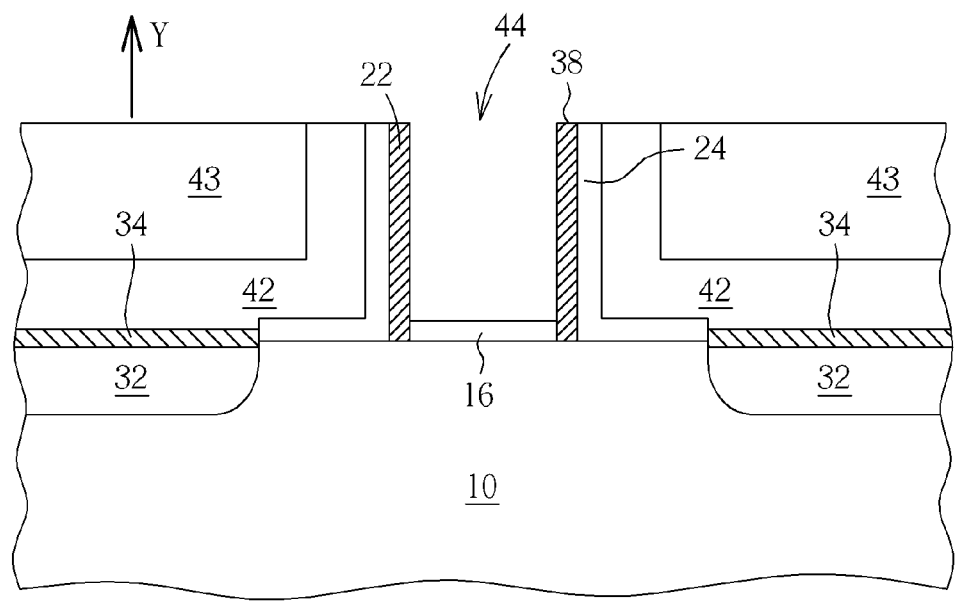
Figure 9:
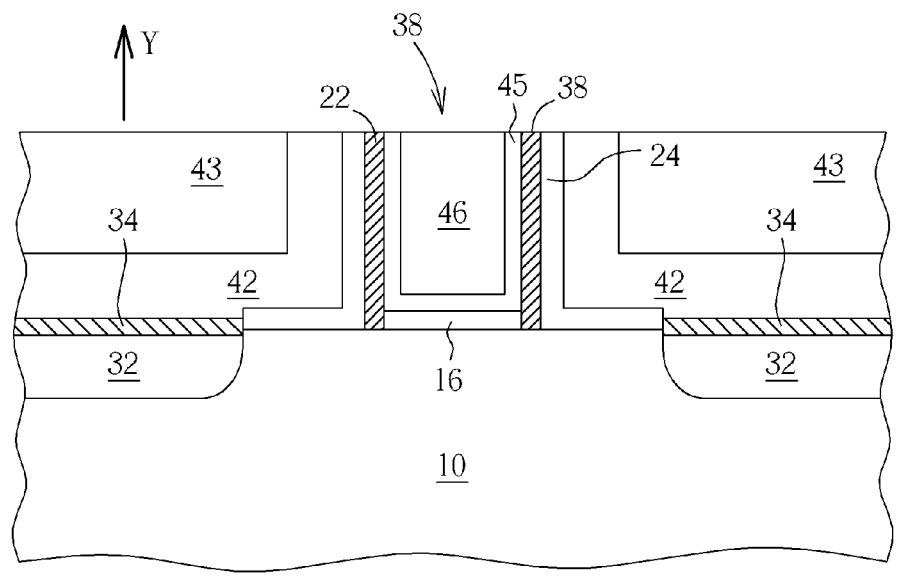

As shown in FIG. 8, the gate electrode 18 is removed by a dry etch, a wet etch or a combination thereof to form an opening 44. The gate dielectric layer 16 is exposed through the opening 44. As shown in FIG. 9, a work function layer 45 covering the gate dielectric layer 16 is formed by a metal organic chemical vapor deposition, a molecular beam epitaxial process, a chemical vapor deposition, or a physical vapor deposition. Subsequently, a metal gate 46 is formed to fill in the opening 44. The metal gate 46 can be Al, W, TiAl, CoWP or other metals. At this point, a metal gate transistor 38 is completed. In the following processes, interlayer wires, an interlayer dielectric and contact plugs can be formed by conventional steps. Besides, before the work function layer 45 is formed, the gate dielectric layer 16 can be removed for forming a new gate dielectric layer (not shown). The new gate dielectric layer can be hafnium oxide, hafnium silicon oxide, hafnium silicon oxynitride, aluminum oxide, lanthanum oxide, tantalum oxide, yttrium oxide, zirconium oxide, strontium titanate oxide, zirconium silicon oxide, hafnium zirconium oxide, strontium bismuth tantalite, lead zirconate titanate or barium strontium titanate.

FIG. 4 depicts a semiconductor structure formed by the method of trimming spacers provided in the present invention. Please refer to FIG. 4. A semiconductor structure comprising a substrate 10, a gate electrode 18 disposed on the substrate 10 is illustrated. The gate electrode 18 has a top surface 40. A gate dielectric layer 16 disposed between the substrate 10 and the gate electrode 18. The gate electrode 18 can be a sacrifice gate electrode made by polysilicon, and the gate electrode 18 can be replaced by a metal gate in the following process. A silicon carbon nitride spacer 22 surrounds and contacts the gate electrode 18, and the silicon carbon nitride spacer 22 has a top surface 38. At least part of the top surface 38 of the silicon carbon nitride spacer 22 is not higher than the top surface 40 of the gate electrode 18. Specifically, part of the top surface 38 is lower than the top surface 40 of the gate electrode 18. Moreover, a silicon oxide spacer 24 surrounds the silicon carbon nitride spacer 22. The silicon oxide spacer 24 has an L-shape profile. The silicon oxide spacer 24 has a top surface 44, and the top surface 44 is lower than the top surface 38 of the silicon carbon nitride spacer 22. Furthermore, the top surface 44 and the top surface 38 form a continuous profile. FIG. 5 depicts another semiconductor structure formed by the method of trimming spacers provided in the present invention. Please refer to both FIG. 4 and FIG. 5. The difference between FIG. 4 and FIG. 5 is that the entire top surface 38 of the silicon carbon nitride spacer 22 is lower than the top surface 40 of the gate electrode 18. Positions of other elements illustrated in FIG. 5 are substantially the same as those in FIG. 4.

Figure 10:
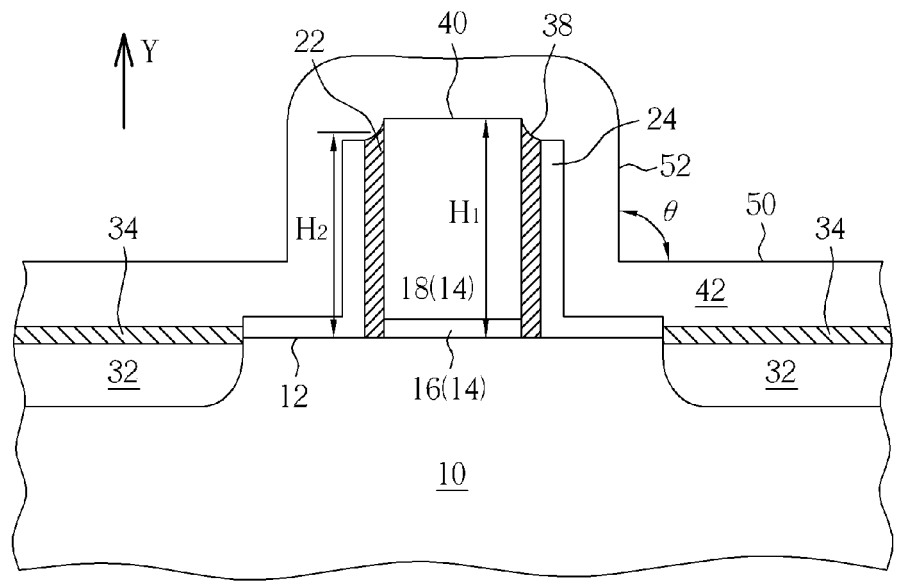

FIG. 10 depicts another semiconductor structure formed by the method of trimming spacers provided in the present invention. As shown in FIG. 10, a semiconductor structure includes a substrate 10 having a top surface 12. A gate electrode 18 is disposed on the substrate 10. The gate electrode 18 has a top surface 40. A gate dielectric layer 16 is disposed between the substrate 10 and the gate electrode 18. A silicon carbon nitride spacer 22 surrounds the gate electrode 18, and the silicon carbon nitride spacer 22 has a top surface 38. A silicon oxide spacer 24 surrounds the silicon carbon nitride spacer 22. A CESL 42 covers the substrate 10, the gate electrode 18, the silicon carbon nitride spacer 22 and the silicon oxide spacer 24. The CESL 42 contacting the top surface 12 has a horizontal surface 50, and the CESL 42 contacting the sidewall of the silicon oxide spacer 24 has a vertical surface 52. An angle θ between the horizontal surface and the vertical surface is 88 to 96 degrees.

If the angle θ between the horizontal surface 50 and the vertical surface 52 is smaller than a specific angle, for example, 86 degrees, the interlayer dielectric layer 43 can not fill up the space between two adjacent gate electrodes 18, therefore, some space will still remain between the two gate electrodes 18. If angle θ between the horizontal surface 50 and the vertical surface 52 is larger than a specific angle, for example, 97 degrees, this means the height of the CESL 42 is not enough, and the gate electrode may be exposed. Accordingly, the angle θ is the present invention is limited between 88 to 96 degrees.

According to a preferred embodiment of the present invention, a distance between the top surface 40 and the top surface 12 is defined as a first height $H_1$, and a distance between the top surface 38 and the top surface 12 is defined as a second height $H_2$. The first height $H_1$ is not smaller than the second height. Preferably, the first height $H_1$ is larger than the second height $H_2$.

The etching ratio of the silicon carbon nitride is smaller than silicon nitride with respect to phosphate acid. In the conventional process, after the silicon nitride spacer is removed, the top surface of the silicon carbon nitride spacer will still be higher than the top surface of the gate electrode, which means the extruded silicon carbon nitride spacer will influence the flatness of the material layer formed around and on the gate electrode in the following steps. The present invention increases the exposure area of the silicon carbon nitride spacer by etching the silicon oxide spacer to a greater degree than in the conventional process. Therefore, the exposure area of the silicon carbon nitride spacer can be partly removed by phosphate acid. At the end of the semiconductor process, at least part of the top surface of the silicon carbon nitride spacer will be lower than the top surface of the gate electrode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor structure, comprising:
a substrate having a first top surface;
a gate electrode having a second top surface and disposed on the substrate;
a silicon carbon nitride spacer having third top surface and the silicon carbon nitride spacer surrounding the gate electrode, wherein the second top surface and the third top surface form a continuous profile,
a silicon oxide spacer surrounding the silicon carbon nitride spacer;
a first height defined between the second top surface and the first top surface;
a second height defined between the third top surface and the first top surface, wherein the first height is larger than the second height; and
a material layer covering the substrate, the gate electrode, the silicon carbon nitride spacer and the silicon oxide spacer, wherein the material layer contacting the first top surface has a horizontal surface, the material layer contacting a sidewall of the silicon oxide spacer has a vertical surface, and an angle between the horizontal surface and the vertical surface is between 88 to 96 degrees.

* * * * *